(12) United States Patent
Brown et al.

(10) Patent No.: US 6,514,777 B2
(45) Date of Patent: Feb. 4, 2003

(54) BUILT-IN INSPECTION TEMPLATE FOR A PRINTED CIRCUIT

(75) Inventors: Marshall L. Brown, Brackney, PA (US); James A. Busby, Vestal, NY (US); Raymond A. Phillips, Jr., Vestal, NY (US); John A. Potenza, Endwell, NY (US); Jirina D. Shupp, Friendsville, PA (US); J. Robert Young, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 100 days.

(21) Appl. No.: 09/757,523

(22) Filed: Jan. 10, 2001

(65) Prior Publication Data

US 2001/0017765 A1 Aug. 30, 2001

Related U.S. Application Data

(63) Continuation of application No. 09/237,090, filed on Jan. 25, 1999, now Pat. No. 6,212,077.

(51) Int. Cl.$^7$ .................... H01L 21/66; H01L 23/544
(52) U.S. Cl. .................................. 438/15; 348/126
(58) Field of Search ................. 361/767, 775, 361/777, 779; 174/261; 257/48, 668, 691, 692, 695, 730, 775, 784, 786; 348/87, 126; 324/765; 29/833; 438/15, 16, 128, 129

(56) References Cited

U.S. PATENT DOCUMENTS

| | | | |
|---|---|---|---|
| 4,080,512 A | 3/1978 | Ramet et al. | 257/775 |
| 4,109,096 A | 8/1978 | Dehaine | 257/668 |
| 4,648,053 A | 3/1987 | Fridge | |
| 4,942,619 A | 7/1990 | Takagi et al. | |
| 5,060,389 A | 10/1991 | Frederick | |
| 5,485,398 A | 1/1996 | Yamazaki et al. | 348/126 |
| 5,502,278 A | 3/1996 | Mabboux et al. | 257/691 |
| 5,566,877 A | 10/1996 | McCormack | |
| 5,633,529 A | 5/1997 | Otsuki | 257/691 |
| 5,642,158 A | 6/1997 | Petry, III et al. | |
| 5,686,699 A | 11/1997 | Chu et al. | 174/261 |
| 5,801,927 A | 9/1998 | Watanabe | 361/777 |
| 5,864,470 A | 1/1999 | Shim et al. | 361/777 |
| 5,866,940 A | 2/1999 | Takata et al. | 257/691 |

FOREIGN PATENT DOCUMENTS

EP    0 285 820 A2    12/1988

OTHER PUBLICATIONS

C.D. Abbott et al., "Templates for Substrate Inspections," IBM Technical Disclosure Bulletin vol. 25, No. 12 (May 1983).

*Primary Examiner*—Kamand Cuneo
*Assistant Examiner*—John B. Vigushin
(74) *Attorney, Agent, or Firm*—RatnerPrestia; Larry R. Fraley, Esq.

(57) ABSTRACT

An improved bonding strip for a printed circuit to facilitate quality inspection. The bonding strip has functional regions and non-functional regions. A functional region is indicated by an area of the bonding strip having a first dimension in width. A non-functional region is indicated by an area of the bonding strip having a second dimension in width. The first dimension may be either wider or narrower than the second dimension.

4 Claims, 4 Drawing Sheets

BUILT-IN INSPECTION TEMPLATE FOR A PRINTED CIRCUIT

This application is a continuation of U.S. Patent application Ser. No. 09/237.090, filed on Jan. 25, 1999, now U.S. Pat. No. 6,212,077. The present invention relates generally to printed circuits and, more particularly, to a structure and method for indicating non-functional areas of a bonding strip on a printed circuit board or a chip carrier.

BACKGROUND OF THE INVENTION

During the manufacture of semiconductor devices, such as integrated circuits, inspection operations are conducted to ensure that the product being produced conforms to the quality standards of the manufacturer. Defects, alignment tolerances, and surface irregularities are just a few of the characteristics of a printed circuit which are inspected. As the printed circuit is fabricated, it moves through various-assembly stages. During assembly, inspections occur to ensure that features on the printed circuit (for example, bonding strips) are suitable for wire bonding.

Bonding strips are metallization surfaces on a printed circuit, or a chip carrier. The metallizations include conductors, voltage planes, ground planes, pads, and surface lands. The metallizations are used to electrically connect components to each other. Typically, a chip carrier has voltage and ground rings completely encircling a die. Wire leads from the die are connected to the voltage and ground rings by wire bonding. In a typical application, a die or chip may have hundreds of leads that need to be connected. Once the leads on the chip have been wire bonded, the chip may be packaged, often in plastic or ceramic, to form an integrated circuit device.

FIG. 1 depicts a die 18 attached to a conventional chip carrier 10. The die 18 has an array of terminal pads 20 for various input-output or "I/O" signals. Hundreds of terminal pads 20 are typical around the circumference of the die 18. Also shown are two bonding strips 12 and 14 surrounding the die 18. The bonding strips 12 and 14 are metallic strips deposited on the chip carrier 10, typically formed from copper or gold plating. Each bonding strip 12 and 14 has a predetermined voltage reference: for example, bonding strip 12 may carry a positive voltage reference and bonding strip 14 may carry a ground voltage reference. Leads 16, which are attached by soldering, connect I/O pads 20 to bonding strips 12 and 14.

Although there are typically hundreds of I/O leads 16 branching out from the die 18, most of the surface areas of the metallic bonding strips 12 and 14 are not used. In a typical application, only 35% to 40% of each metallic bonding strip 12 and 14 is used; therefore, most of the surface area of each bonding strip 12 and 14 is non-functional. Nevertheless, before assembly of the chip carrier 10 with the die 18, the entirety of each bonding strip 12 and 14 must be inspected for defects.

Any defects, such as scratches, pits, stains, or debris contamination, on the bonding strips 12 and 14 will result in rejection of the chip carrier 10. Because the inspector does not know which areas on the bonding strips 12 and 14 are functional and which areas are nonfunctional, a defect anywhere on the bonding strips 12 and 14 will cause a blanket rejection of the chip carrier 10. Inspection of an entire bonding strip 12, 14 is time consuming, and a blanket rejection of the chip carrier 10 is economically inefficient. Accordingly, it is desirable to provide a cost-effective structure on the chip carrier 10 that may help the inspector in deciding whether a defect on a metallic bonding strip 12, 14 is critical or not critical.

Structures, such as templates, are known for easing inspection of a semiconductor device. One example of a template is disclosed in U.S. Pat. No. 5,566,877 issued to McCormack. McCormack teaches a method for inspection by using a template image overlayed on top of a semiconductor device. The template image includes transparent regions and opaque regions. The opaque regions block out all areas of the device not associated with the characteristic being inspected, while the transparent regions highlight the area of interest. Using the superimposed image, the inspector can quickly focus on the area of the device requiring attention.

Another example of a template is disclosed by Frederick in U.S. Pat. No. 5,060,389. Frederick teaches a template adapted for placement in and removal from an optical tube of a microscope. The template is a transparent film selectively patterned by photographic methods from information contained in the manufacturer's database of die and package outlines and dimensions. By combining the image of the semiconductor device with the image of the template, an instantaneous determination of correct size, orientation, and placement can be made.

Yet another example of a template is provided in an article by Abbott et al. titled "Templates for Substrate Inspections," IBM Technical Disclosure Bulletin, Vol. 25, No. 12, page 6350, published May 1983. Abbott et al. disclose an overlay on a substrate for covering non-functional areas. The overlay is transparent over functional areas.

The templates discussed above are overlay structures and are not part of the semiconductor device itself. That is, the template may be placed on the semiconductor device during inspection, but may also be removed from the device after inspection. Another type of template, which is a structure built into the semiconductor device, has been disclosed in European Patent Application No. 0 285 820, published Dec. 10, 1988. This publication teaches a semiconductor device that includes terminal pads having two different shapes. The terminal pads that are functional are patterned into a square shape, and the terminal pads that are non-functional are patterned into a triangular shape. Because the final passivation layer that is deposited over the pad metal level of the semiconductor chip is transparent, the two shapes of the terminal pads may be distinguished during inspection. This facilitates inspection of solder balls fabricated on the terminal pads, because rework of defective solder balls on non-functional pads may be avoided.

The deficiencies of the conventional bonding strips formed on printed circuit boards or chip carriers and of the conventional methods for inspecting such bonding strips show that a need still exists. To overcome the shortcomings of the conventional devices and methods, a new structure and method are provided. An object of the present invention is to provide a structure that permits inspection of selective surface areas of the bonding strip. A related object is to reduce the inspection time of each bonding strip. Another object is to substantially eliminate unnecessary and costly rejections of printed circuit boards or chip carriers.

SUMMARY OF THE INVENTION

To meet these and other objects, and in view of its purposes, the present invention provides a structure and method for forming a bonding strip on a printed circuit. The bonding strip has functional regions and non-functional regions. A functional region is indicated by an area of the bonding strip having a first dimension in width. A non-functional region is indicated by an area of the bonding strip having a second dimension in width. The first dimension may be either wider or narrower than the second dimension. The bonding strip may be deposited on an integrated circuit, a chip carrier, or a printed circuit board.

It is understood that the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

The present invention provides an inexpensive method and structure for inspecting bonding strips on a printed circuit board or a chip carrier. Instead of inspecting the entire surface area of a bonding strip, the present invention provides a structure that permits inspection of selective surface areas of the bonding strip. As a result, inspection time of each bonding strip is reduced. Unnecessary and costly rejections of printed circuit boards or chip carriers are substantially eliminated.

Generally, the method of inspecting in accordance with the present invention involves positioning the printed circuit board or chip carrier under a microscope and transmitting a magnified image of the device from the microscope to a computer monitor via a camera. The bonding strips plated on the laminated board are then examined visually by an operator. The operator needs to examine only critical areas of the bonding strips; the critical areas are those surface areas that are expected to have wire leads bonded onto them. Surface areas that are not critical, that is areas that are expected to be devoid of bonded wire leads, need not be examined by the operator.

The critical areas, or functional regions, are examined to determine whether the regions fall within accepted standards set by the manufacturer. Each bonding strip, which typically includes copper and gold plated features, is inspected in its functional regions for characteristics, such as scratches, pits, debris, contamination, stains, and the like. If the functional regions conform with the quality standards of the manufacturer, the printed circuit board, or chip carrier, is accepted. Otherwise, the printed circuit board, or chip carrier, is rejected. Although non-functional regions of a bonding strip may also be inspected, they need not be inspected to the same quality standards set for the functional regions of the strip.

Figure 1:
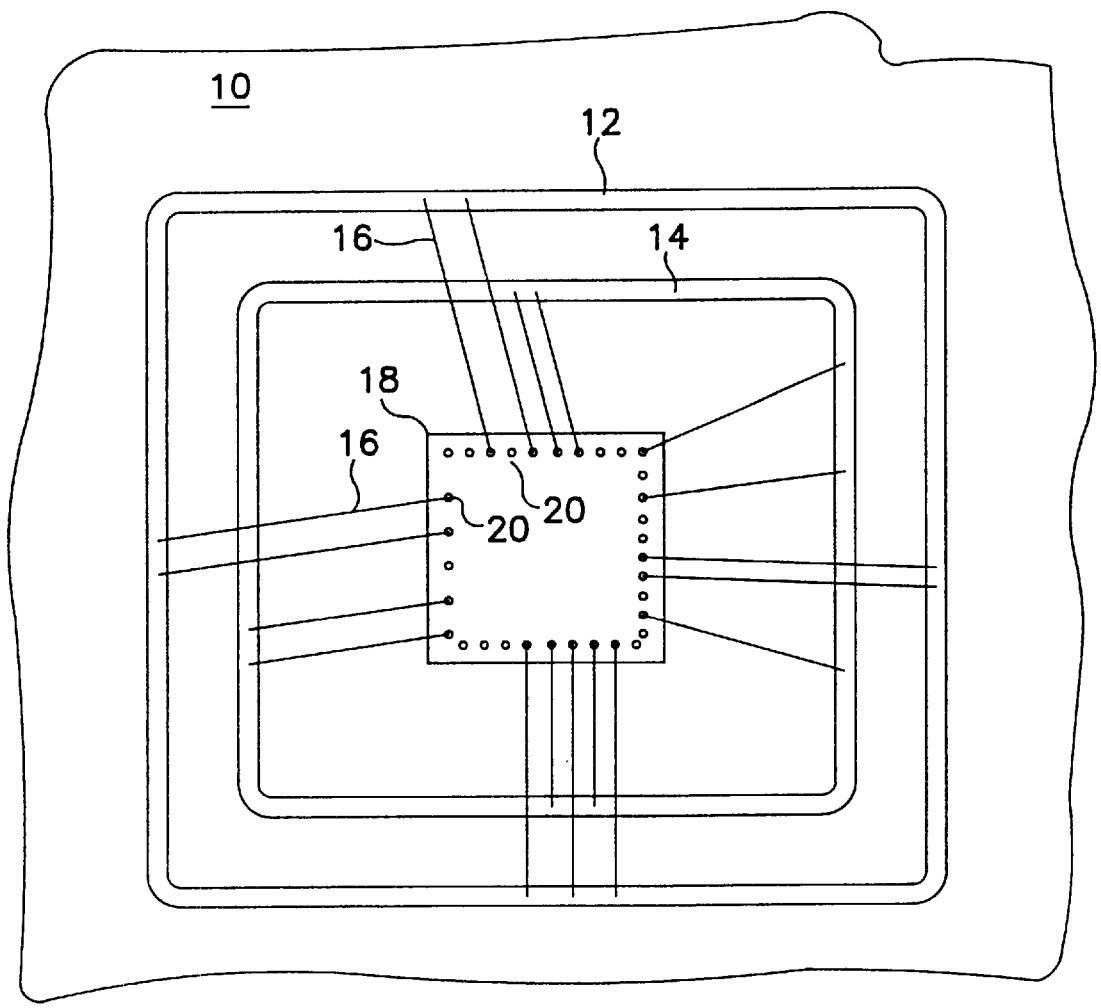
FIG. 1 is an illustration of a chip carrier having a die and two conventional bonding strips.
Figure 2:
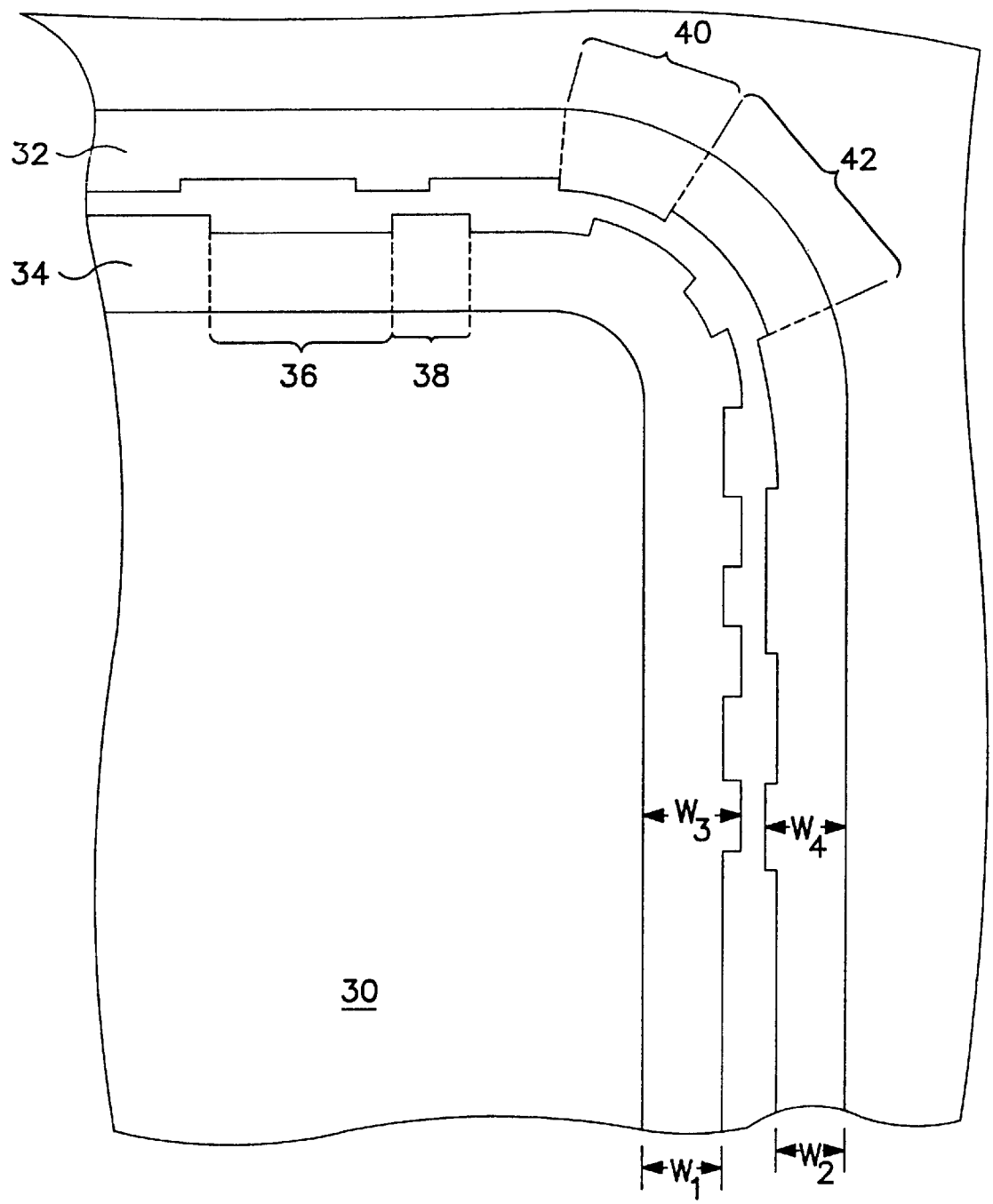
FIG. 2 is and illustration of a portion of a chip carrier having two bonding strips formed in accordance with the present invention.
Figure 3:
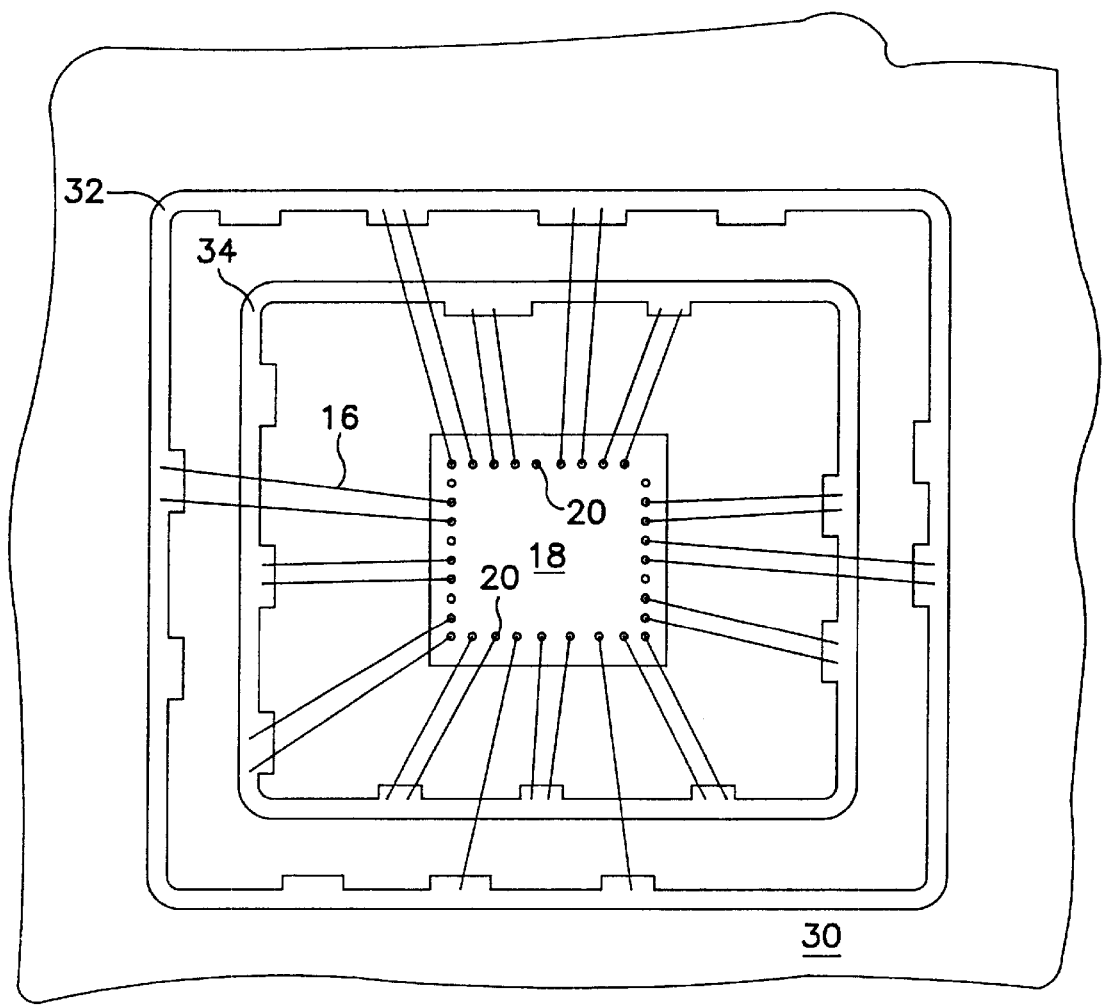
FIG. 3 is an illustration of the chip carrier of FIG. 2 having a die and leads bonded between the die and the two bonding srtips, the latter formed in accordance with the present invention.

These and other features and advantages of the present invention will be more clearly understood from the following detailed description in conjunction with FIGS. 2 and 3. FIG. 2 illustrates a section of chip carrier 30 in accordance with one embodiment of the present invention. Two bonding strips 32 and 34 are shown deposited on the surface of the chip carrier 30. Each bonding strip 32 and 34 is typically deposited by electroplating copper and gold onto the chip carrier 30.

The type of processes for making the bonding strips 32 and 34 are not critical to the present invention. As an example, bonding strip 32 may be a power-carrying strip, such as a positive voltage reference. Bonding strip 34 may be a ground reference strip. Although other configurations are possible, bonding strips 32 and 34 are illustrated as forming two separate rings in FIG. 3.

As also shown in FIG. 3, semiconductor die 18 is mounted inside the circumference of the bonding strips 32 and 34. Semiconductor die 18 includes a plurality of bond pads 20, which are electrically coupled to the bonding strips 32 and 34 by a plurality of wire leads 16. The wire leads 16 are connected by conventional methods to the bonding strips 32 and 34. Some of the wire leads 16 are shown connected to the outer bonding strip 32 and some are shown connected to the inner bonding strip 34.

Referring again to FIG. 2, bonding strip 32 has functional regions and non-functional regions. As an example, functional region 40 is expected to contain wire leads 16 and, consequently, is a critical region for inspection; non-functional region 42 is not expected to have wire leads 16 and is not critical for inspection. Defects observed within functional region 40 result in rejection of chip carrier 30, whereas defects observed within non-functional region 42 do not necessarily result in rejecting the chip carrier 30. In a similar manner, bonding strip 34 has a non-functional region 36 and a functional region 38.

The width of the bonding strip is the determining factor in whether a particular region of the bonding strip is a functional region or a non-functional region. The functional region of the bonding strip has a first width and the non-functional region has a second width. In the embodiment shown in FIGS. 2 and 3, the functional region is wider than the non-functional region. As shown in FIG. 2, the non-functional regions 42 and 36 of bonding strips 32 and 34 have widths $W_2$ and $W_1$, respectively. The functional regions 40 and 38 of bonding strips 32 and 34 have wider widths $W_4$ and $W_3$, respectively.

It is readily seen that the inspector may easily differentiate between regions of a bonding strip that are critical and must be held to a high quality standard, and regions of a bonding strip that are not critical and may be held to a lesser standard. If the inspector observes that a stain, for example, is present in a non-functional region, the chip carrier 30 may still pass inspection. If a similar stain is discovered on a functional region of the bonding strip, however, the chip carrier is rejected.

Figure 4:
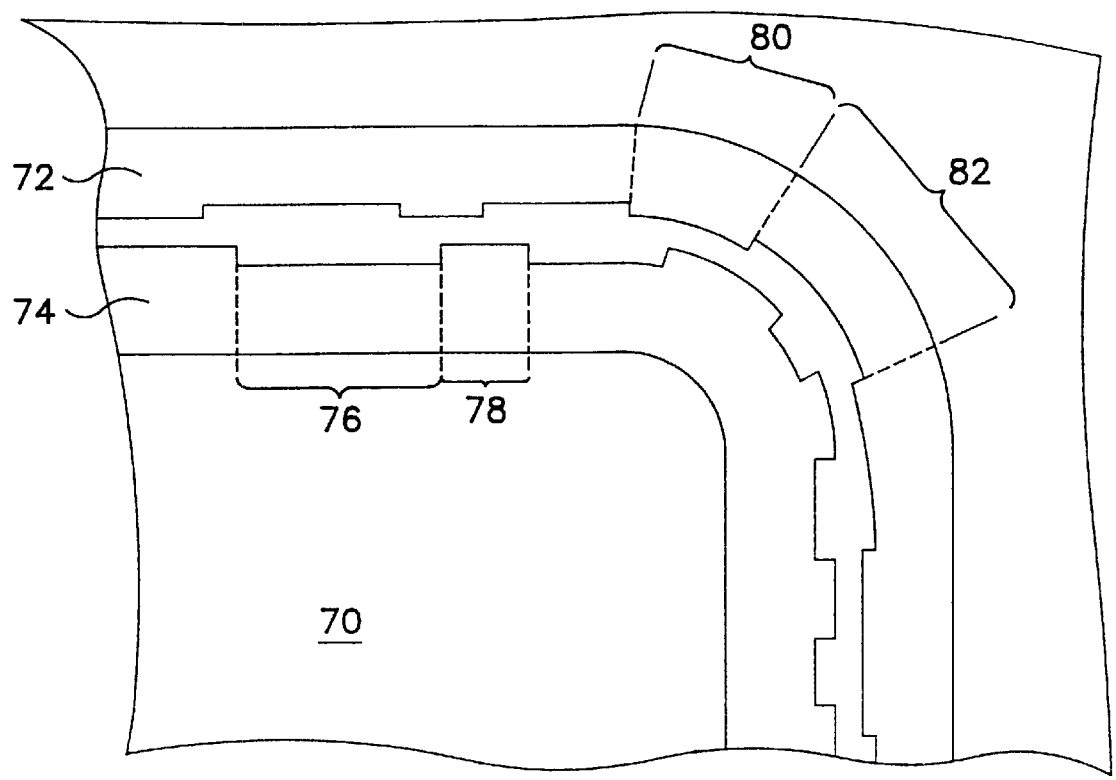
FIG. 4 is an illustration of a portion of a chip carrier having two bonding strips formed in accordance with another embodiment of the present invention.

Although the present invention has been particularly shown and described with reference to a preferred embodiment, it will be understood by those skilled in the art that various changes in detail may be made without departing from the spirit, scope, and teaching of the invention. For example, the functional regions of a bonding strip may have a narrow width and the non-functional regions of the bonding strip may have a wider width. In other words, critical regions and non-critical regions may be the opposite of the previously described embodiment. This is shown in FIG. 4. As shown, chip carrier 70 has bonding strips 72 and 74, whereby regions 76 and 82 are functional regions but regions 78 and 80 are non-functional regions. In this embodiment, the non-functional regions are wider than the functional regions. Furthermore, although the bonding strips are shown to be ring-like in shape and completely surrounding the die, other shapes, widths, and configurations of the bonding strip may be selected. Accordingly, the structure and method disclosed are to be considered merely as illustrative.

What is claimed:

1. A method for facilitating defect inspection by an inspector of a bonding strip comprising the steps of:

providing a semiconductor substrate having device and interconnection metallurgy;

depositing a bonding strip on the semiconductor substrate having (a) a first region of a first dimension in width, and (b) a second region of a second dimension in width, wherein the first region is used as the functional region and the second region is used as the non-functional region;

guiding the inspector to inspect the first region for defects of the bonding strip, including at least scratches, pits, debris, contamination and strains, on the basis of the first dimension in width.

2. The method of claim 1 wherein the first dimension is wider than the second dimension.

3. The method of claim 1 wherein the second dimension is wider than the first dimension.

4. The method of claim 1 including a step of:

rejecting the semiconductor substrate in response to guiding the inspector.

* * * * *